United States Patent [19]

Chmielewski et al.

[11] Patent Number: 5,336,988
[45] Date of Patent: Aug. 9, 1994

[54] SCALAR S-PARAMETER TEST SET FOR NMR INSTRUMENTATION MEASUREMENTS

[75] Inventors: Thomas Chmielewski, Highland Heights; David A. Molyneaux, Willowick; William O. Braum, Twinsburg, all of Ohio

[73] Assignee: Picker International, Inc., Highland Heights, Ohio

[21] Appl. No.: 16,042

[22] Filed: Feb. 10, 1993

[51] Int. Cl.[5] ............................................. G01R 33/00
[52] U.S. Cl. .................................. 324/76.19; 324/322
[58] Field of Search ............... 324/76.19, 76.21, 76.22, 324/76.23, 76.24, 76.25, 76.26, 76.27, 77.11, 76.28, 76.29, 76.31, 76.49, 76.51, 300, 307, 318, 322

[56] References Cited

U.S. PATENT DOCUMENTS 5,241,272  8/1993  Axel .................................... 324/318
5,258,718  11/1993 Duerr .................................. 324/309

Primary Examiner—Michael J. Tokar
Attorney, Agent, or Firm—Fay, Sharpe, Beall, Fagan, Minnich & McKee

[57] ABSTRACT

An RF device (A) under test is connected with ports or jacks (14, 16) of an S-parameter test set (B). An RF input jack (18) is connected with an RF tracking signal output (20) of a spectrum analyzer (C) to receive an RF tracking signal. An output jack (22) is connected with a receiver input (24) of the spectrum analyzer. A mode control (30) internal to the test set is controlled by a programmable control sequence generator (34) of the spectrum analyzer. The mode control controls a switch array (32), preferably PIN diodes, which interconnect the RF input jack (18), the RF output jack (22), the two jacks (14, 16) that are connected to the device under test, and a 50 Ohm termination (54) in four modes to make reflection measurements and two transmission measurements. DC bias jacks (26, 28) are connected with a DC power for injecting a DC component into the RF signals applied to the device under test.

15 Claims, 2 Drawing Sheets

SCALAR S-PARAMETER TEST SET FOR NMR INSTRUMENTATION MEASUREMENTS

BACKGROUND OF THE INVENTION

The present invention relates to S-parameter measurement systems. It finds particular application in conjunction with measurement systems for measuring transmission and reflection parameters of radio frequency coils of magnetic resonance scanners and will be described with particular reference thereto. It is to be appreciated, however, that the present invention will also be useful for quantifying performance of RF coils and other RF hardware, such as transmission/reception boxes, probe multiplexers, preamplifiers, and the like.

Heretofore, the RF coils of magnetic resonance imaging devices have been measured with a network analyzer in conjunction with an S-parameter test set. A network analyzer is a large, complex piece of laboratory equipment. Its large size and high cost render it undesirable to make it a part of each service technician's repair kit which is carried to the site of an MR imaging system.

When it is necessary to test or check the parameters of the RF coil of an MR imaging system, the coil is commonly interconnected with an S-parameter test set, which, in turn, is interconnected with the network analyzer. The S-parameter test set allows the network analyzer to make transmission and reflection measurements into both forward and reverse directions.

Rather than using an S-parameter test kit, one can use a reflection/transmission kit and a resistive divider. Although the reflection transmission kit and the resistive divider are significantly less costly than an S-parameter test set, the much more expensive network analyzer is still needed. Moreover, although the reflection/transmission kit allows the necessary measurements to be made, the coil must be disconnected and reconnected in different ways to make all of the measurements to determine the S-parameters. To save connecting and reconnecting the coil, one can use a two port measurement instrument in conjunction with the network analyzer.

In order to avoid the weight and the cost of a network analyzer, the S-parameters can be measured using a less expensive spectrum analyzer in conjunction with a directional bridge and a single port device. With this arrangement, it is possible to measure port 1 of a two port coil while port 2 is manually terminated with a 50 Ohm terminator. Port 2 can then be measured by swapping the device under test, making port 2 the input port and port 1 the terminated port. The transmission parameter can be measured by removing the directional bridge and hooking port 1 to the source output on the spectrum analyzer and then hooking port 2 to the receiver input. All of these measurements require moving the coil or other device under test and changing the test setup. The addition of cables and terminations required for some measurements can change the measured parameters and cause inaccurate results. Moreover, this arrangement has no provision for DC bias.

The present invention contemplates a new and improved S-parameter test kit for use in conjunction with a spectrum analyzer which overcomes the above-referenced problems and others.

SUMMARY OF THE INVENTION

In accordance with one aspect of the present invention, an RF parameter test system is provided which includes first and second jacks or other connecting means for interconnection with an RF device, a third jack or connecting means for receiving an RF signal and a fourth jack or electrical connecting means for providing signals to an input of a spectrum analyzer. A switching means selectively interconnects the four jacks or connecting means and an internal termination means into each of four configurations for measuring RF transmission in one direction through the RF device, transmission in an opposite direction through the RF device, reflection of an RF signal applied to one end of the RF device, and reflection of an RF signal applied to the other end of the RF device. A switch control means selectively controls the switching means to switch it among these four configurations.

In accordance with a more limited aspect of the present invention, a switch control means is adapted to receive computer generated control signals from a programmable portion of the spectrum analyzer, which signals sequentially designate the four configurations.

In accordance with another aspect of the present invention, the switching means includes a plurality of PIN diodes, the switch control means selectively applies DC biases to the PIN diodes to switch among the four configurations.

In accordance with yet another aspect of the present invention, the switch control means has four outputs, each of which carries a high or low bias voltage. The four outputs are interconnected in different ways to the PIN diode switching means to apply four different biases to the PIN diode switching means to switch among the four configurations.

In accordance with another aspect of the present invention, the system further includes a pair of DC bias jacks or other electrical connection means for selectively injecting a DC component into the RF signal applied to each end of the RF device.

In accordance with another aspect of the present invention, the RF parameter test system is built into a magnetic resonance imaging apparatus and interconnected with a spectrum analyzer means thereof which receives and processes encoded magnetic resonance signals in the course of generating images.

One advantage of the present invention is that it is ideally suited for use by service technicians. It is light weight, portable, and relatively inexpensive.

Another advantage of the present invention resides in its simplicity and accuracy. It can make all S-parameter measurements automatically without operator intervention, improving efficiency, eliminating operator error, and eliminating inaccuracies attributable to changes in the test setup.

Another advantage of the present invention is that it is useable in close proximity to or as an integral part of an NMR system.

Yet another advantage of the present invention is that it enables DC bias to be injected into the RF device under test.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
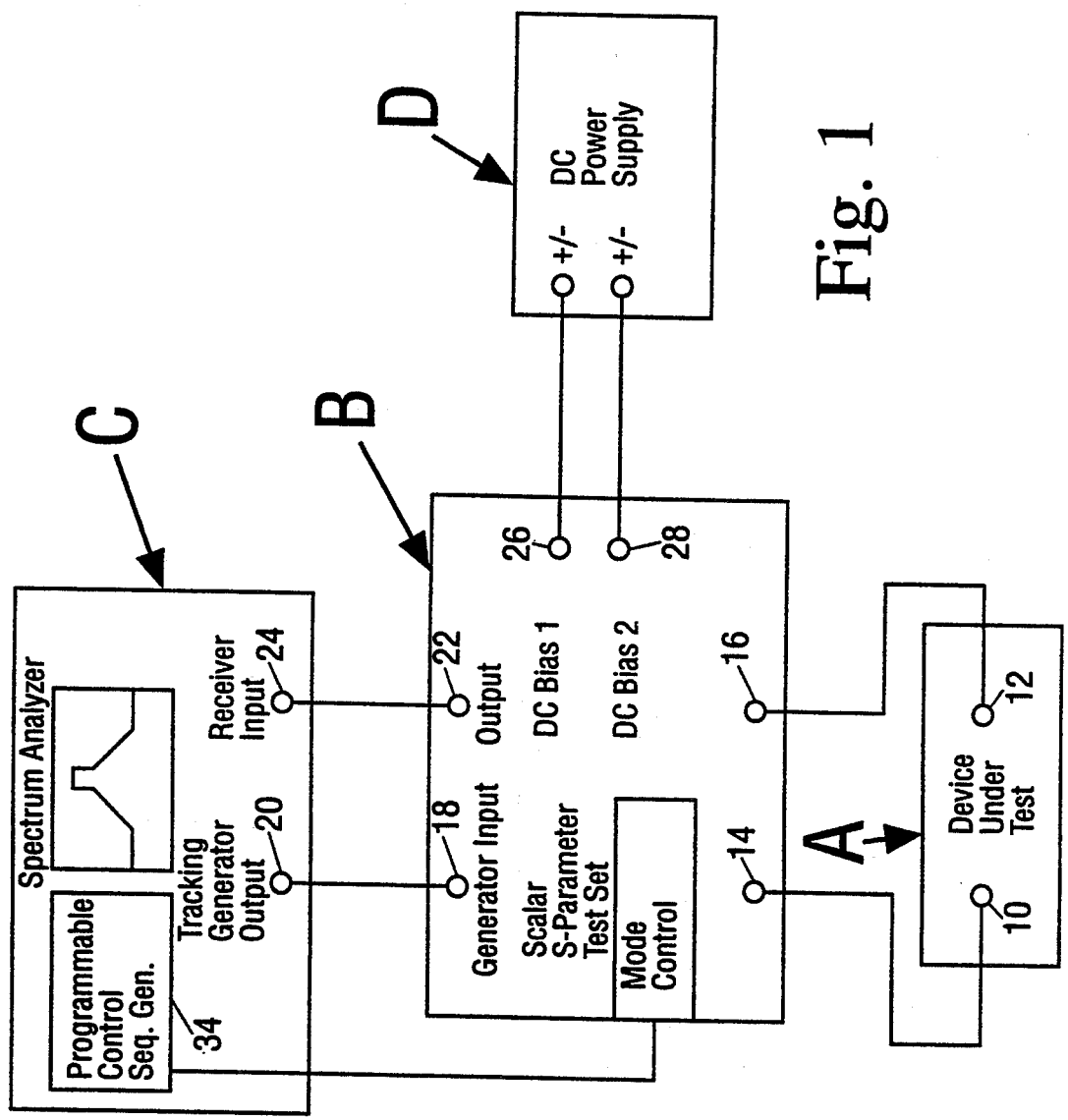
FIG. 1 is a diagrammatic illustration of a test setup illustrating a parameter test system in accordance with the present invention in combination with a device under test, a spectrum analyzer, and a DC power supply; and, FIG. 2 is a schematic illustration of the parameter test apparatus in accordance with the present invention.

With reference to FIG. 1, an MR device A, such as an RF coil from a magnetic resonance imaging system, has two terminals 10, 12. The terminals are interconnected with first and second connecting means 14, 16, such as ports or jacks of an RF parameter test means B. The RF parameter test means further includes a third connecting means or jack 18 which receives a tracking generator signal from a tracking signal output 20 of a spectrum analyzer C. The RF parameter test means B further has a fourth connecting means or jack 22 which provides an RF output signal to a receiver input 24 of the spectrum analyzer. The RF parameter test means B further includes a fifth and sixth connection means or jacks 26, 28 which selectively receive DC bias signals from a DC power supply D.

The RF parameter test means B further includes a mode selection or control means 30. The mode control means selectively controls a switching means 32 which switches the RF parameter test means among four modes in which ($S_{11}$) reflection at jack 14, ($S_{12}$) transmission from jack 14 to jack 16, ($S_{21}$) transmission from jack 16 to jack 14, and ($S_{22}$) reflection at jack 16 are measured. Preferably, the spectrum analyzer C includes a programmable control sequence generator 34 which generates a series of control signals which causes the mode control means 30 to switch the RF parameter test means B into each of its four modes sequentially.

Figure 2:
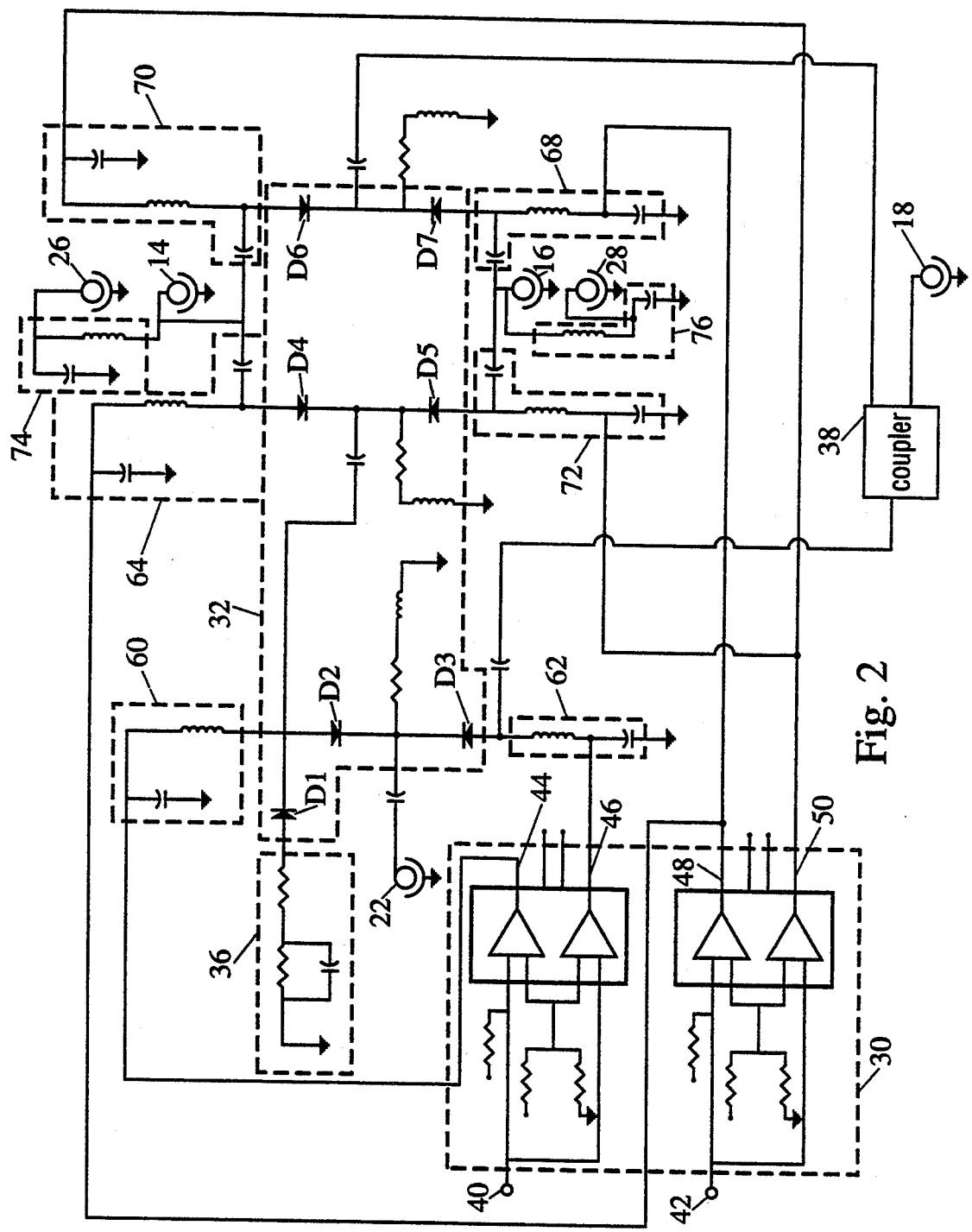

With reference to FIG. 2, in the first reflection mode ($S_{11}$), the reflection from the first jack 14 is measured. The first jack 14 is connected by a switch or PIN diode D6 with the third or tracking signal input jack 18. The second jack 16 is connected by a switch, such as PIN diodes D5, D1 with a 50 Ohm termination 36. The fourth or output jack 22 is connected by a PIN diode or other switch D3 with the third or tracking signal input jack 18. In the first transmission mode ($S_{12}$), the transmission from the first jack 14 to the second jack 16 is measured. The first jack 14 is connected by the PIN diode or other switching means D6 with the tracking signal input 18. The second jack 16 is connected by the PIN diodes or switches D5, D2 with the fourth or output jack 22. In the second transmission mode ($S_{21}$), the transmission from the second jack 16 to the first jack 14 is measured. The first jack 14 is connected by a PIN diodes or switches D4, D2 with the output jack 22. The second jack 16 is connected by a PIN diode or switch D7 with the tracking signal input jack 18. In the second reflection mode ($S_{22}$), the reflection at the second jack 16 is measured. The first jack 14 is connected by switches or PIN diodes D4, D1 with the termination The tracking signal input jack 18 is connected by switch or diode D7 to the second jack 16 and by switch or PIN diode D3 to the fourth or output jack 22. A coupler 38 is connected with the tracking signal input 18 for splitting the tracking signal in the reflection modes between the output jack 22 and the selected one of jacks 14 and 16. In this manner, the selected one of jacks 14 and 16 are isolated from the output jack 22.

In the preferred embodiment, the switching means 32 includes the array of PIN diodes D1-D7 which are biased by the control means 30 to assume either an "on" or conductive mode or an "off" or non-conductive mode. The mode selection or control means 30 has two inputs 40, 42 which are configured to receive a high or a low signal, e.g. a binary 1 or 0 signal. When a high signal is received on input 40, an operational amplifier pair causes an output 44 to produce a high, preferably +12 VDC bias signal and output 46 to produce a low, preferably -12 VDC bias signal. When input 40 receives a low signal, the bias signals on outputs 44 and 46 reverse, i.e. output 44 carries -12 VDC bias signal and put 46 carries +12 VDC bias signal. Analogously, an operation amplifier pair causes an output 48 to carry the high bias signal, e.g. +12 VDC, when input 42 receives a high signal, and an output 50 to produce a low bias, e.g. -12 VDC. When input 42 receives a low signal, the biases on the outputs 48 and 50 reverse. It is to be appreciated that the magnitude of the signals at bias outputs 44, 46, 48, and 50 are selected in accordance with the design characteristics of the switching means 32.

Isolation networks 60, 62, 64, 66, 68, and 70 are connected between the outputs 44–50 of the mode control means 30 and the switching means 32. Each of the isolation networks include an inductor which provides a high impedance at RF frequencies but permits DC to pass and a capacitor which provides an RF frequency short to ground but an open circuit to DC. The capacitor removes any residual RF signal which passes through the inductance. In the preferred embodiments, the isolation circuits provide about 40 dB of RF to DC isolation. The first isolation means 60 isolates the mode selection output 44 from biased PIN diode switches D1, D2. The second isolation means 62 isolates the mode selection output 46 from PIN diode switch D3 and the coupler 38. The third isolation means 64 isolates the mode selection output 48 from the first jack 14 and the PIN diode switch D4. The fourth isolation means 66 isolates the mode selection output 48 from the second jack 16 and the PIN diode switch D7. The fifth isolation means 70 isolates the mode selection output from the first jack 14 and the PIN diode switch D6. The sixth isolation means 72 isolates the mode selection output 50 from the jack 18 and the PIN diode switch D5.

Optionally, other biasing schemes may be devised which turn the PIN diodes D1-D7 or other switches on and off in the pattern indicated in TABLE 1.

TABLE 1

| | PIN DIODE STATES | | | | | | |
|---|---|---|---|---|---|---|---|
| MODE | D1 | D2 | D3 | D4 | D5 | D6 | D7 |
| $S_{11}$ | ON | OFF | ON | OFF | ON | ON | OFF |
| $S_{12}$ | OFF | ON | OFF | OFF | ON | ON | OFF |
| $S_{21}$ | OFF | ON | OFF | ON | OFF | OFF | ON |
| $S_{22}$ | ON | OFF | ON | ON | OFF | OFF | ON |

The DC input jack 26 allows DC to enter the first jack 14 for DC biasing the RF coil or other device under test. Analogously, the DC input jack 28 allows DC to enter the second jack 16 for DC biasing the RF device under test. Isolating means 74, 76 block the passage of RF between the DC input jacks and the first and second jacks 14, 16. Other capacitive filters prevent the passage of DC bias signals.

Of course, the switching means 32 may be composed of other than PIN diodes. For example, the PIN diodes can be replaced with shunt switches which are controlled by the mode control means 30 to be open and closed in accordance with TABLE 1. As another alternative, TEE switches can replace diodes D2-D7 to improve isolation from port to port and between ports or jacks and the tracking generator. As yet another alternate embodiment, the PIN diodes can be replaced by tuned switches which improves isolation from port to port and from the ports or jacks to the tracking generator.

The circuit of FIG. 2 preferably has a characteristic impedance of 50 Ohms for testing 50 Ohm RF devices. For testing 75 or 100 Ohm devices, the impedance of the circuit of FIG. 2 is preferably adjusted to 75 or 100 Ohms, respectively. Optionally, additional impedance switching means may be provided for enabling 50, 75, or 100 Ohms or other selectable impedances. The termination 36 and diode D1 may be replaced with a series of different impedance terminations selectable by a rotary or other selection switching means.

The operational amplifier pairs in the mode selection means 30 are convenient for converting binary 1,0 signals to the selected biasing voltages. However, manual switches may also be used which selectively connect the +12 VDC, −12 VDC, or bias potentials to the outputs 44, 46, 48, and 50.

As another option, tuning elements can be added for discrete frequencies in order to improve isolation over selected, limited bandwidths.

Preferably, the RF parameter test means B is housed in a shielded enclosure to reduce environmental interference from other sources. This enables the device to be used closely adjacent the bore of a magnetic resonance imager. The circuits themselves are preferably etched on a printed circuit board such that the critical traces are microstrip traces of the desired characteristic impedance.

Optionally, the parameter test means B may be used in conjunction with portions of a magnetic resonance imaging device which are the equivalent of a separate spectrum analyzer. The excitation output from a transmitter of an NMR system can be connected with the tracking signal port or jack 18. A search loop can be connected with the first jack or port 14 and an output of the RF coil of the system can be connected to the second jack or port 16. The output jack or port 22 is connected to the receiver of the NMR system spectrum analyzer means. This interconnection enables the magnetic resonance system to display substantially the same output as the spectrum analyzer. In this manner, a field service engineer can perform the above-discussed RF parameter tests without carrying a spectrum analyzer to the site of a magnetic resonance apparatus. Of course, the RF parameter test means B can be made an integral part of a magnetic resonance apparatus and permanently connected as described.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. An RF parameter test system comprising:
   first and second connecting means for interconnection with first and second terminals of a radio frequency device to be tested;
   a third connecting means for receiving an RF tracking signal;
   a fourth connecting means for providing an RF output signal to a spectrum analyzer means;
   a switching means for selectively interconnecting the first, second, third, and fourth electrical connection means and a termination means such that:
   in a first reflection mode, the first and third connection means are interconnected, the third and fourth connection means are interconnected, and the second connection means is connected with the termination means,
   in a second reflection mode, the second and third connection means are interconnected, the third and fourth connection means are interconnected, and the first connection means is connected with the termination means,
   in a transmission mode, the first and third connection means are electrically connected and the second and fourth connection means are electrically interconnected;
   a mode selection means for selectively controlling the switching means to select among the first and second reflection modes and the transmission mode.

2. The system as set forth in claim 1 wherein the switching means includes an array of PIN diodes which interconnect the first, second, third, and fourth electrical connection means with each other and the termination means, the mode selection control means includes means for selectively applying four combinations of high and low biasing potentials, each pattern of biasing potentials biasing the PIN diodes of the PIN diode array conductive and non-conductive in such a manner that a corresponding one of the first and second reflection and transmission modes is achieved.

3. The system as set forth in claim 2 further including a coupling means connected with the third electrical connection means and connected at least twice with the switching means such that the switching means can switch two electrical connection means into electrical communication with the third electrical contact means while isolating such other electrical contact means from each other.

4. The system as set forth in claim 3 wherein the PIN diode array of the switching means includes:
   a first PIN diode connected with the termination means;
   a second PIN diode connected between the first PIN diode and the fourth electrical connection means;
   a third PIN diode connected between the fourth electrical connection means and the coupling means;
   a fourth PIN diode connected between the first electrical connection means and the first PIN diode;
   a fifth PIN diode connected between the second electrical connection means and the fourth PIN diode;
   a sixth PIN diode connected between the first electrical connection means and the coupling means; and
   a seventh PIN diode connected between the second electrical connection means and the coupling means.

5. The system as set forth in claim 4 further including:

a first RF/DC isolation filter means connected between the mode selection means and an interconnection of the first and second PIN diodes;
a second RF/DC isolation means connected between the mode selection means and the third PIN diode;
a third RF/DC isolation means connected between the mode selection means and the fourth PIN diode;
a fourth RF/DC isolation means connected between the mode selection means and the fifth PIN diode;
a fifth RF/DC isolation means connected between the mode selection means and the sixth PIN diode;
a sixth RF/DC isolation means connected between the mode selection means and the seventh PIN diode.

6. The system as set forth in claim 1 further including:
a fifth electrical connection means which is adapted to be connected with a source of DC potential;
an RF/DC isolation means which electrically interconnects the first and fifth electrical connection means such that DC potential applied to the fifth electrical contact means is supplied to the first electrical connection means and RF signals are blocked from travelling between the first and fifth electrical connection means.

7. The system as set forth in claim 6 further including:
a sixth electrical connection means which is adapted to be connected with a source of DC potential;
an RF/DC isolation means which electrically interconnects the second and sixth electrical connection means such that DC potential applied to the sixth electrical contact means is supplied to the second electrical connection means and RF signals are blocked from travelling between the second and sixth electrical connection means.

8. An RF parameter test system comprising:
a spectrum analyzer means including a means for generating a tracking RF signal and an RF receiver;
first and second connecting means for interconnection with first and second terminals of a radio frequency device to be tested;
a third connecting means for receiving the RF tracking signal;
a fourth connecting means for providing an RF output signal to a spectrum analyzer means;
a switching means for selectively interconnecting the first, second, third, and fourth electrical connection means and a termination means such that:
in a first reflection mode, the first and third connection means are interconnected, the third and fourth connection means are interconnected, and the second connection means is connected with the termination means,
in a second reflection mode, the second and third connection means are interconnected, the third and fourth connection means are interconnected, and the first connection means is connected with the termination means,
in a first transmission mode, the first and third connection means are electrically connected and the second and fourth connection means are electrically interconnected, and
in a second transmission mode, the second and third connection means are electrically connected and the first and fourth connection means are electrically interconnected;
a mode selection means for selectively controlling the switching means to select among the first and second reflection modes and the first and second transmission modes.

9. The system as set forth in claim 8 wherein the spectrum analyzer means further includes a programmably controllable sequence generator for generating a sequence of control signals for controlling the mode control means for causing the mode control means to switch among the first and second reflection modes and the first and second transmission modes.

10. The system as set forth in claim 8 further including:
a source of DC potential;
a fifth and sixth electrical connection means connected with the source of DC potential;
a first RF/DC isolation means which electrically interconnects the first and fifth electrical connection means such that DC potential applied to the fifth electrical contact means is supplied to the first electrical connection means and RF signals are blocked from travelling between the first and fifth electrical connection means;
a second RF/DC isolation means which electrically interconnects the second and sixth electrical connection means such that DC potential applied to the sixth electrical contact means is supplied to the second electrical connection means and RF signals are blocked from travelling between the second and sixth electrical connection means.

11. The system as set forth in claim 8 wherein the spectrum analyzer means is an integral subassembly of a magnetic resonance imaging device.

12. The system as set forth in claim 8 wherein the switching means includes:
a first switching means connected with the termination means;
a second switching means connected between the first switching means and the fourth electrical connection means;
a third switching means connected between the third electrical connection means and a coupling means;
a fourth switching means connected between the first electrical connection means and the first switching means;
a fifth switching means connected between the second electrical connection means and the fourth switching means;
a sixth switching means connected between the first electrical connection means and the coupling means; and
a seventh switching means connected between the second electrical connection means and the coupling means, the coupling means connecting the third, sixth, and seventh switching means with the third connecting means and isolating the third switching means from the sixth and seventh switching means.

13. The system as set forth in claim 12 wherein the switching means include PIN diodes.

14. The system as set forth in claim 13 further including:
a first RF/DC isolation filter means connected between the mode selection means and an interconnection of the first, and second PIN diodes;
a second RF/DC isolation means connected between the mode selection means and the third PIN diode;

a third RF/DC isolation means connected between the mode selection means and the fourth PIN diode;

a fourth RF/DC isolation means connected between the mode selection means and the fifth PIN diode;

a fifth RF/DC isolation means connected between the mode selection means and the sixth PIN diode;

a sixth RF/DC isolation means connected between the mode selection means and the seventh PIN diode.

15. An RF parameter test method comprising:

connecting first and second terminals of a radio frequency device to be tested with first and second connecting means;

switching among a first reflection mode, a second reflection mode, a first transmission mode, and a second transmission mode such that:

in the first reflection mode, an RF tracking signal is split and connected with the first connection means and a spectrum analyzer, and the second connection means is connected with a termination device, in the second reflection mode, the RF tracking signal is split and connected with the second connection means and the spectrum analyzer, and the first connection means is connected with the termination device, in a first transmission mode, the RF tracking signal is connected with the first connection means and the second connection means is connected with the spectrum analyzer, and in a second transmission mode, the RF tracking signal is connected with the second connection means and the first connection means is connected with the spectrum analyzer.

* * * * *